(12) United States Patent
Huang et al.

(10) Patent No.: US 10,494,711 B2
(45) Date of Patent: Dec. 3, 2019

(54) EVAPORATION APPARATUS AND EVAPORATION METHOD

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jiunsung Huang, Beijing (CN); Yongqi Shen, Beijing (CN); Lankai Yeh, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/502,941

(22) PCT Filed: Aug. 12, 2016

(86) PCT No.: PCT/CN2016/094991
§ 371 (c)(1),
(2) Date: Feb. 9, 2017

(87) PCT Pub. No.: WO2017/067302
PCT Pub. Date: Apr. 27, 2017

(65) Prior Publication Data
US 2017/0268096 A1    Sep. 21, 2017

(30) Foreign Application Priority Data

Oct. 21, 2015  (CN) .......................... 2015 1 0688878

(51) Int. Cl.
*H01L 51/00* (2006.01)
*C23C 14/24* (2006.01)
(Continued)

(52) U.S. Cl.
CPC .......... *C23C 14/243* (2013.01); *C23C 14/042* (2013.01); *C23C 14/044* (2013.01);
(Continued)

(58) Field of Classification Search
None
See application file for complete search history.

(56) References Cited

U.S. PATENT DOCUMENTS

2006/0070576 A1\* 4/2006 Kim ........................ C23C 14/12
118/727

FOREIGN PATENT DOCUMENTS

CN          1302173 A       7/2001
CN          1690245 A       11/2005
(Continued)

OTHER PUBLICATIONS

The Second Chinese Office Action dated Sep. 29, 2017; Appln. No. 201510688878.3.
(Continued)

*Primary Examiner* — Jack S Chen

(57) ABSTRACT

An evaporation apparatus comprises an evaporation chamber (2) and a moving device (3); the evaporation chamber (2) is provided with an evaporation source (21) therein and is provided with two regulating plates (22) on a side wall thereof; the moving device (3) is disposed on the bottom of the evaporation chamber (2). An evaporation method by use of the evaporation apparatus is also disclosed.

18 Claims, 3 Drawing Sheets

(51) Int. Cl.
      *C23C 14/04*          (2006.01)
      *C23C 14/54*          (2006.01)

(52) U.S. Cl.
      CPC ............ *C23C 14/24* (2013.01); *C23C 14/542* (2013.01); *C23C 14/548* (2013.01); *H01L 51/001* (2013.01)

(56) References Cited

FOREIGN PATENT DOCUMENTS

| | | |
|---|---|---|
| CN | 101962750 A | 2/2011 |
| CN | 102934253 A | 2/2013 |
| CN | 103210113 A | 7/2013 |
| CN | 203807547 U | 9/2014 |
| CN | 105177510 A | 12/2015 |
| JP | 2002-167664 A | 6/2002 |
| JP | 2004-225058 A | 8/2004 |

OTHER PUBLICATIONS

First Chinese Office Action dated Apr. 1, 2017: Appln. No. 201510688878.3.
International Search Report and Written Opinion dated Nov. 7, 2016; PCT/CN2016/094991.

* cited by examiner

EVAPORATION APPARATUS AND EVAPORATION METHOD

TECHNICAL FIELD

Embodiments of the present disclosure relate to an evaporation apparatus and an evaporation method.

BACKGROUND

With the rapid development of the OLED (Organic Light-Emitting Diode) industry, new organic materials are emerging. In order to meet the design requirements of different products, there is a need to use a conventional evaporation apparatus to quickly evaporate the new organic materials into organic thin films with different properties.

As shown in FIG. 1, the conventional evaporation apparatus comprises a substrate 1 and an evaporation chamber 2. The evaporation chamber 2 is provided with a linear evaporation source 21 therein and is provided with two regulating plates 22 on its side wall. The substrate 1 is positioned directly above the linear evaporation source 21. When performing vacuum evaporation, the organic material in the evaporation source 21 is vaporized into organic material molecules and forms an organic thin film on the substrate 1.

The evaporation region and the evaporation angle of the linear evaporation source are defined by the regulating plates. After the structure of the evaporation apparatus is determined according to the organic material to be evaporated, the evaporation angle is fixed. If the organic material to be evaporated is varied, the structure of the evaporation apparatus is required to be re-determined and the evaporation apparatus needs to be tested for several times so as to ensure that the evaporation apparatus can achieve the optimum performance. During this process, it is necessary to perform the operations of opening the chamber, reconstruction and film test and etc. on the evaporation apparatus for several times. However, since the organic material is inclined to be oxidized, the organic material reacts with the air entering the evaporation chamber after the chamber is opened. Thus, the organic material needs to be replaced after the chamber is opened. This process is not only time-consuming but also a waste of resources.

SUMMARY

At least one embodiment of the present disclosure provides an evaporation apparatus comprising an evaporation chamber and a moving device; wherein the evaporation chamber is provided with an evaporation source therein and is provided with two regulating plates on side walls thereof; the moving device is disposed below the evaporation chamber, the moving device actuates the evaporation source to move up and down relative to the regulating plates.

In one embodiment of the present disclosure, the moving device is disposed below the evaporation source.

In one embodiment of the present disclosure, the moving device actuates the evaporation source to move up and down, thereby changing a relative height between the evaporation source and the regulating plates.

In one embodiment of the present disclosure, the moving device is disposed below the regulating plates.

In one embodiment of the present disclosure, the moving device actuates the regulating plates to move up and down, thereby changing a relative height between the regulating plates and the evaporation source.

In one embodiment of the present disclosure, the moving device is a bellows.

In one embodiment of the present disclosure, the evaporation apparatus further comprises a servo motor control system which is configured to be connected with the moving device, so as to actuate the moving device to move up and down.

In one embodiment of the present disclosure, the evaporation source is a linear evaporation source.

In one embodiment of the present disclosure, the evaporation chamber comprises two main evaporation chambers and an impurity evaporation chamber which is positioned between the two main evaporation chambers.

In one embodiment of the present disclosure, the evaporation apparatus further comprises a mask plate which is disposed above the evaporation chamber.

At least one embodiment of the present disclosure provides an evaporation method by use of the evaporation apparatus mentioned above, comprising:

obtaining evaporation conditions for a new organic material when a change of organic material in the evaporation chamber is detected, the evaporation conditions at least comprising evaporation range and thickness distribution;

adjusting a relative height between the evaporation source and the regulating plates according to the evaporation condition for the new organic material; and evaporating the new organic material.

In one embodiment of the present disclosure, adjusting a relative height between the evaporation source and the regulating plates according to the evaporation conditions for the new organic material comprises:

according to the evaporation conditions for the new organic material, driving the moving device positioned below the evaporation source by the servo motor control system; and the moving device actuating the evaporation source to move up and down, thereby changing the relative height between the evaporation source and the regulating plates.

In one embodiment of the present disclosure, adjusting a relative height between the evaporation source and the regulating plates according to the evaporation conditions for the new organic material comprises:

according to the evaporation condition for the new organic material, driving the moving device positioned below the regulating plates by the servo motor control system; and the moving device actuating the regulating plates to move up and down, thereby changing the relative height between the evaporation source and the regulating plates.

In one embodiment of the present disclosure, the method further comprises:

by adjusting the heights of the regulating plates on both sides of any one of the main evaporation chambers and the impurity evaporation chamber, adjusting a boundary mixing efficiency of the main material in the main evaporation chamber and the impurity material in the impurity evaporation chamber.

In one embodiment of the present disclosure, the method further comprises:

based on the mask plate, obtaining a preset evaporation area by adjusting the relative height between the evaporation source and the regulating plates.

The moving device is disposed on the bottom of the evaporation chamber, and actuates the evaporation chamber to move up and down, thereby changing the relative height between the evaporation source and the regulating plates, as a result of which the evaporation conditions for various organic materials can be met without any reconstruction of the evaporation apparatus. Not only the flexibility of the apparatus is significantly improved, but also the consumption of time and resources are saved.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

Reference signs:

| | |
|---|---|
| 1. substrate; | 2. evaporation chamber; |
| 21. evaporation source; | 22. regulating plate; |
| 3. moving device; | 4. servo motor control system; |
| 5. mask plate; | A. main evaporation chamber; |
| B. impurity evaporation chamber; | C. main evaporation chamber. |

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
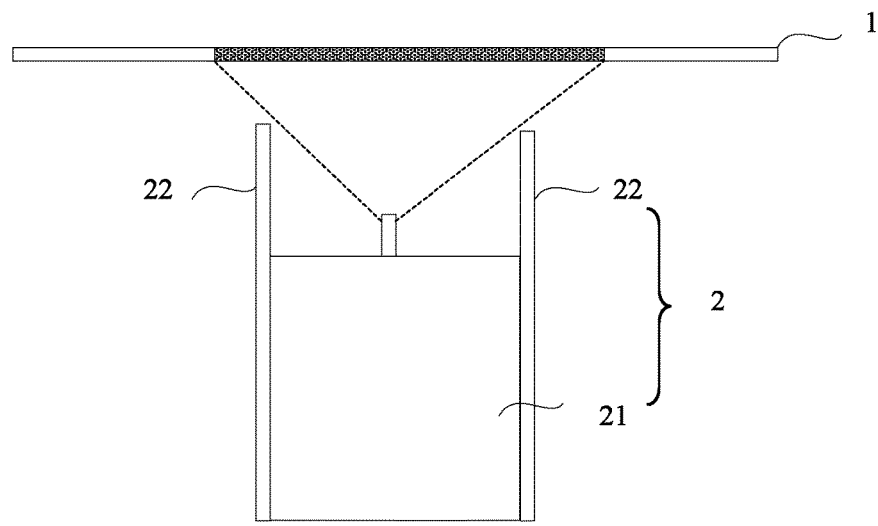
FIG. 1 is an illustrative structural view of a conventional evaporation apparatus.
Figure 2:
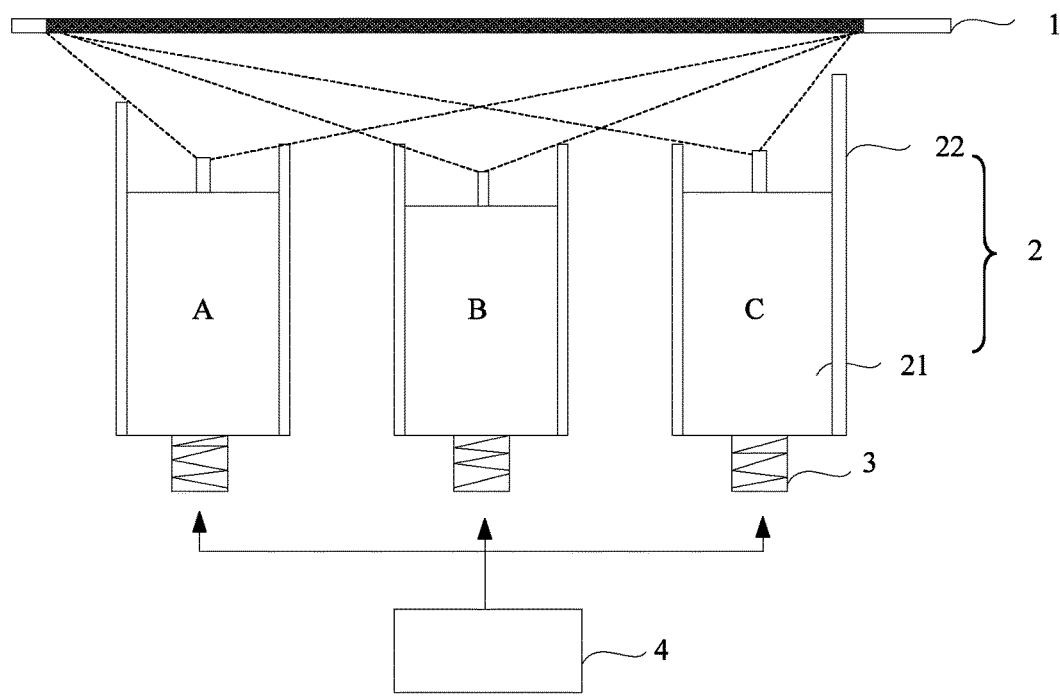
FIG. 2 is an illustrative structural view of an evaporation apparatus according to an embodiment of the present disclosure.

In the current field of OLED evaporation, the conventional design as shown in FIG. 1 is just applicable to particular organic materials and product process and lacks flexibility, although it can control the evaporation angle and the evaporation range of a single evaporation source. If such an evaporation apparatus is made suitable to different organic materials, the evaporation apparatus needs to be reconstructed. To improve the flexibility of the evaporation apparatus and significantly reduce wastes of reconstruction cost, time and material due to change of evaporation material, at least one embodiments of the present disclosure provides an evaporation apparatus. Referring to FIG. 2, the evaporation apparatus comprises an evaporation chamber 2 in which an evaporation source 21 is provided and a moving device 3. The evaporation source 21 is a linear evaporation source and is usually an organic material. A side wall of the evaporation chamber is provided with two regulating plates 22 for controlling evaporation conditions of the organic material. The evaporation conditions comprise evaporation range and thickness distribution and the like. When performing evaporation, in order that the organic material in the evaporation chamber 2 can form a film on the substrate 1, the substrate 1 is disposed directly above the evaporation chamber 2, and the material to be evaporated is vaporized from the evaporation source 21 and is deposited on a surface of the substrate 1 facing towards the evaporation apparatus. The regulating plate 22 on the left side of the evaporation chamber 2 is configured to regulate the evaporation angle, the evaporation range and the thickness distribution when the evaporation source 21 performs a deposition on the left side of the substrate 1. The regulating plate 22 on the right side of the evaporation chamber 2 is configured to regulate the evaporation angle, the evaporation range and the thickness distribution when the evaporation source 21 performs a deposition on the right side of the substrate 1. Further, to facilitate adjusting a relative height between the evaporation source and the regulating plates, the moving device 3 is disposed on the bottom of the evaporation chamber 2.

The evaporation chamber 2 comprises the evaporation source 21 and the regulating plates 22. The moving device 3 can be disposed on the bottom of the evaporation chamber 2 in various manners.

In one embodiment of the present disclosure, as illustrated in FIG. 2, the moving device 3 can be disposed on the bottom of the evaporation source 21. When the moving device 3 moves up and down, the relative height between the evaporation source 21 and the regulating plates 22 can be changed and thus the evaporation angle, the evaporation range, the thickness distribution and the like of the evaporation source 21 can be changed.

Figure 3:
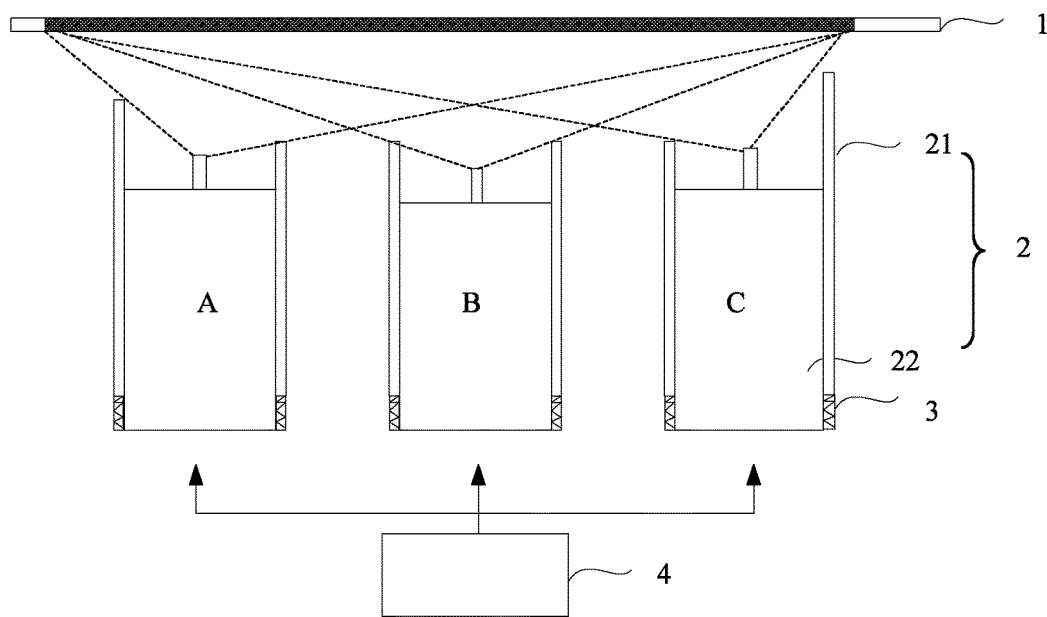
FIG. 3 is an illustrative structural view of an evaporation apparatus according to an embodiment of the present disclosure.

In another embodiment of the present disclosure, as illustrated in FIG. 3, the moving device can be disposed at the bottom of each regulating plate 22. When the moving device 3 moves up and down, the relative height between the evaporation source and the regulating plate 22 can be changed and thus the evaporation angle, the evaporation range, the thickness distribution and the like of the evaporation source 21 can be changed. It is to be noted that in typical circumstances, the evaporation source 21 needs to form organic thin films varying in the range, the thickness and the like on the left and right sides of the substrate 1. Therefore, the moving heights of the left and right regulating plates 22 controlled by the moving device 3 by use of the method of according to the embodiments of the present disclosure are different. The moving heights of the left and right regulating plates 22 can be determined by the evaporation conditions of the evaporation source 21.

By disposing the moving device 3 on the bottom of the evaporation chamber 2, the present embodiment can control the evaporation angle, the evaporation range, the evaporation thickness and the like of the organic material evaporation source in a flexible manner, thereby improving the boundary mixing efficiency of the material. For example, the moving device 3 can be a bellows.

As illustrated in FIG. 2 and FIG. 3, the evaporation apparatus further comprises a servo motor control system 4 configured to drive the moving device 3 which is connected with the moving device 3 and can be disposed on the bottom of the moving device 3. For example, the moving device 3 can be a bellows and is rotated by the servo motor control system 4, thereby actuating the evaporation source 21 to move up and down so as to change the height of the evaporation source 21 relative to the regulating plates 22.

In the field of display, the thin film of organic material deposited on the substrate 1 by evaporation is usually a kind of mixed material. To meet the evaporation requirement, the evaporation chamber 2 comprises two main evaporation chambers storing therein the main materials and one impurity evaporation chamber storing therein the impurity material. To have a more uniform doping during the evaporation process, the impurity evaporation chamber is positioned between the two main evaporation chambers. As illustrated in FIG. 2 and FIG. 3, the evaporation chamber A and the evaporation chamber C are main evaporation chambers and the evaporation chamber B is an impurity evaporation chamber. When there is a need to change the boundary mixing efficiency of the organic materials in the main evaporation chambers and the impurity evaporation chamber on the substrate 1, the relative heights between the evaporation sources in the impurity evaporation chambers and the impurity evaporation chamber and the regulating plates can be rapidly adjusted by the moving device, thereby greatly improving the adaptability of the apparatus.

Figure 4:
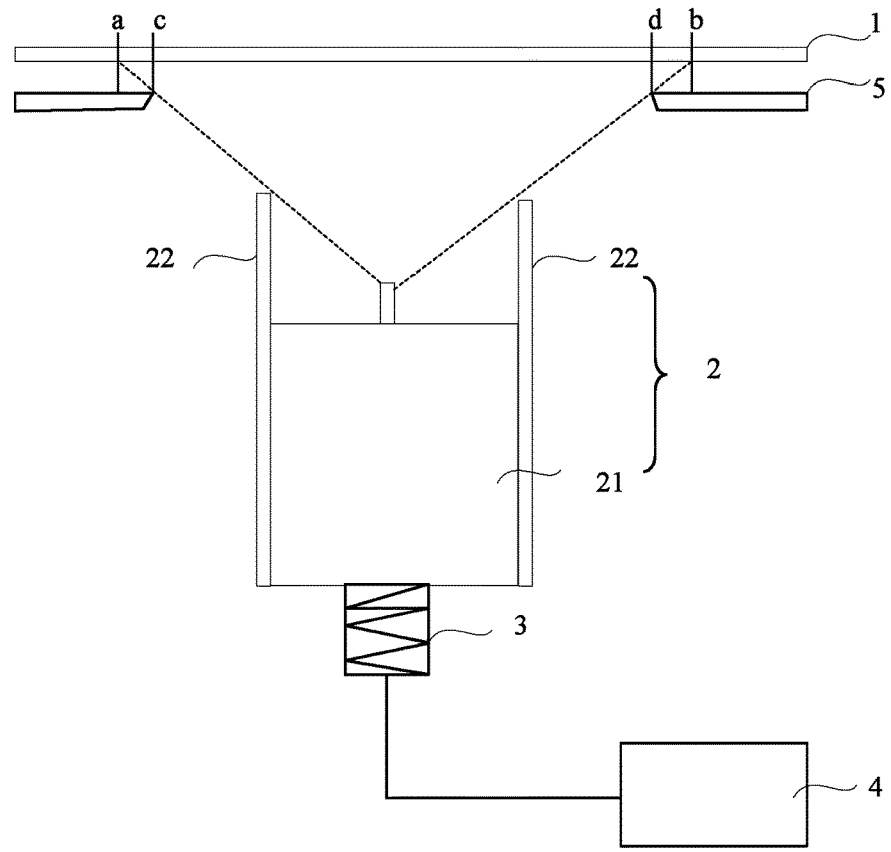
FIG. 4 is an illustrative structural view of an evaporation apparatus according to an embodiment of the present disclosure.

The evaporation apparatus usually further comprises a mask plate 5. As illustrated in FIG. 4, the mask plate 5 is disposed between the substrate 1 and the evaporation chamber 2. By providing the mask plate 5, thin films of organic material with different thicknesses, different properties and different patterns can be precisely deposited on the different areas of the substrate 1 by evaporation, and thereby achieving a control on mask shadow effect. In the present embodiment, according to the design requirement, the mask plate 5 provided in the evaporation apparatus can have various forms.

In one embodiment of the present disclosure, the moving device is disposed on the bottom of the evaporation chamber, and actuates the evaporation chamber to move up and down, thereby changing the relative height between the evaporation source and the regulating plates, as a result of which the evaporation conditions for various organic materials can be met without any reconstruction of the evaporation apparatus. Not only the flexibility of the apparatus is significantly improved, but also the consumption of time and resources are saved.

Figure 5:
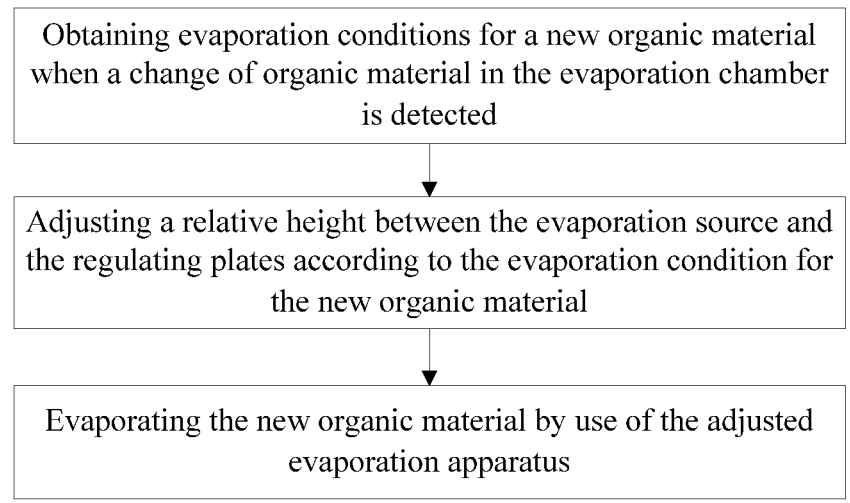
FIG. 5 is a flow chart of an evaporation method according to an embodiment of the present disclosure.

By use of any one of the evaporation apparatuses as illustrated in FIG. 2 to FIG. 4, at least one embodiments of the present disclosure provides an evaporation method. Referring to FIG. 5, the flow of the evaporation method comprises:

obtaining an evaporation condition for a new organic material, when a change of organic material in the evaporation chamber is detected;

adjusting a relative height between the evaporation source and the regulating plates according to the evaporation condition for the new organic material; and evaporating the new organic material by use of the adjusted evaporation apparatus.

The evaporation condition at least comprises evaporation range and thickness distribution. Typically, various organic materials have various evaporation conditions. When the organic material in the evaporation chamber is varied, a user can input an evaporation condition into the evaporation apparatus and the newly input evaporation condition is used as evaporation condition for the new organic material.

And then, the relative height between the evaporation source and the regulating plates is adjusted in accordance with the evaporation condition for the new organic material.

As can be seen from FIG. 2 and FIG. 3, the moving device can be either disposed on the bottom of the evaporation source or disposed at the bottom of the regulating plates. On the basis of such two different arrangements, the method according to the embodiments of the present disclosure comprises the following two ways for adjusting the relative height between the evaporation source and the regulating plates in accordance with the evaporation condition for the new organic material.

The first way is: according to the evaporation condition for the new organic material, driving the moving device positioned below the evaporation source by the servo motor control system, so that the evaporation source is actuated by the moving device to move up and down, thereby changing the relative height between the evaporation source and the regulating plates.

For example, the moving device can be a bellows. In the first way, the height of the regulating plate is constant. If the relative height between the evaporation source and the regulating plates needs to be increased, the moving device positioned below the evaporation source can be driven by the servo motor control system and actuate the evaporation source to move downwards, thereby increasing the relative height between the evaporation source and the regulating plates. If the relative height between the evaporation source and the regulating plates needs to be reduced, the moving device positioned below the evaporation source can be driven by the servo motor control system and actuate the evaporation source to move upwards, thereby reducing the relative height between the evaporation source and the regulating plates.

The second way is: according to the evaporation condition for the new organic material, driving the moving device positioned below the regulating plates by the servo motor control system, so that the regulating plates are actuated to move up and down, thereby changing the relative height between the evaporation source and the regulating plates.

In the second way, the height of the evaporation source is constant. If the relative height between the evaporation source and the regulating plates needs to be increased, the moving device positioned below the regulating plates can be driven by the servo motor control system and actuate the regulating plates to move upwards, thereby increasing the relative height between the evaporation source and the regulating plates. If the relative height between the evaporation source and the regulating plates needs to be reduced, the moving device positioned below the regulating plates can be driven by the servo motor control system to move downwards and actuate the regulating plates to move downwards, thereby reducing the relative height between the evaporation source and the regulating plates.

After the relative height between the evaporation source and the regulating plates is adjusted according to the evaporation condition for the new organic material, the adjusted evaporation apparatus can be used to perform the evaporation of the new organic material. If the relative height between the evaporation source and the regulating plates is increased, then the evaporation angle of the new organic material becomes smaller and the evaporation range becomes smaller accordingly. If the relative height between the evaporation source and the regulating plates is reduced, then the evaporation angle of the new organic material becomes larger and the evaporation range becomes larger accordingly.

In the technical field of vacuum evaporation, the heights of the regulating plates on both sides of the main evaporation chamber and the impurity evaporation chamber determine the boundary mixing efficiency of the main material in the main evaporation chamber and the impurity material in the impurity evaporation chamber and affect the quality of film deposited on the entire substrate. Therefore, in the method according to the embodiments of the present disclosure, by adjusting the heights of the regulating plates on both sides of any one of the main evaporation chambers and the impurity evaporation chamber by the moving device, the boundary mixing efficiency of the main material in the main evaporation chamber and the impurity material in the impurity evaporation chamber is adjusted. For example, the moving device can be a bellows. For example, by reducing the relative height between the evaporation chamber and the regulating plates, the evaporation angle and the evaporation range of the main evaporation chamber and the impurity evaporation chamber can be properly increased, thereby increasing the boundary mixing efficiency. At the same time, by increasing the relative height between the evaporation chamber and the regulating plates, the evaporation angle and the evaporation range of the main evaporation chamber and the impurity evaporation chamber can be properly reduced, thereby reducing the boundary mixing efficiency.

In addition, to deposit the organic material by evaporation in a preset area of the substrate, the method according to the embodiments of the present disclosure further relies on the mask plate disposed above the evaporation apparatus and obtains the preset evaporation area by adjusting the relative height between the evaporation source and the regulating plates. The preset evaporation area is determined by the design requirement of the substrate. FIG. 4 is taken as an example. The evaporation source has the farthest deposition position a on the left side of the substrate, and the farthest deposition position b on the right side of the substrate. The evaporation area is an area between the deposition position a and the deposition position b on the substrate. But, it can be seen from the mask plate disposed above the evaporation apparatus that the required evaporation area is c-d, which can be achieved in this case by increasing the relative height between the evaporation chamber and the regulating plates.

In the method according to the embodiments of the present disclosure, the moving device is disposed on the bottom of the evaporation chamber, and actuates the evaporation chamber to move up and down, thereby changing the relative height between the evaporation source and the regulating plates, as a result of which the evaporation conditions for various organic materials can be met without any reconstruction of the evaporation apparatus. Not only the flexibility of the apparatus is significantly improved, but also the consumption of time and resources are saved.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510688878.3 filed on Oct. 21, 2015, the disclosure of which is hereby entirely incorporated by reference as a part of the present disclosure.

The invention claimed is:

1. An evaporation apparatus comprising:
an evaporation chamber and a moving device;
the evaporation chamber is provided with an evaporation source therein and is provided with two regulating plates on side walls thereof; and
the moving device is disposed below the evaporation chamber;
wherein the moving device is connected with the two regulating plates and actuates the two regulating plates to move up and down to adjusts a relative height between the regulating plates and the evaporation source according to an evaporation condition for an organic material.

2. The evaporation apparatus according to claim 1, wherein the moving device is disposed below the regulating plates.

3. The evaporation apparatus according to claim 2, wherein the evaporation apparatus further comprises a servo motor control system which is connected with the moving device.

4. The evaporation apparatus according to claim 2, wherein the evaporation chamber comprises two main evaporation chambers and an impurity evaporation chamber which is positioned between the two main evaporation chambers.

5. The evaporation apparatus according to claim 1, wherein the evaporation apparatus further comprises a servo motor control system which is connected with the moving device.

6. The evaporation apparatus according to claim 1, wherein the evaporation source is a linear evaporation source.

7. The evaporation apparatus according to claim 1, wherein the evaporation apparatus further comprises a mask plate which is disposed above the evaporation chamber.

8. The evaporation apparatus according to claim 1, wherein the moving device is a bellows.

9. An evaporation method by use of the evaporation apparatus according to claim 1, comprising:
obtaining evaporation conditions for a new organic material when a change of organic material in the evaporation chamber is detected, the evaporation conditions at least comprising evaporation range and thickness distribution;
according to the evaporation condition for the new organic material, driving the moving device connected with the regulating plates to actuate the two regulating plates to move up and down to change the relative height between the evaporation source and the two regulating plates; and
evaporating the new organic material by use of the adjusted evaporation apparatus.

10. The evaporation method according to claim 9, wherein
the moving device is positioned below the two regulating plates.

11. The evaporation method according to claim 9, wherein the evaporation chamber comprises two main evaporation chambers and an impurity evaporation chamber which is positioned between the two main evaporation chambers, and the method further comprises by adjusting the heights of the regulating plates on both sides of any one of the main evaporation chambers and the impurity evaporation chamber, adjusting a boundary mixing efficiency of the main material in the main evaporation chamber and the impurity material in the impurity evaporation chamber.

12. The evaporation method according to claim 9, wherein the evaporation apparatus further comprises a mask plate which is disposed above the evaporation chamber and the method comprises:
based on the mask plate, obtaining a preset evaporation area by adjusting the relative height between the evaporation source and the regulating plates.

13. The evaporation apparatus according to claim 1, wherein the evaporation chamber comprises two main evaporation chambers and an impurity evaporation chamber which is positioned between the two main evaporation chambers.

14. An evaporation apparatus, comprising:
an evaporation chamber and a moving device;

the evaporation chamber is provided with an evaporation source therein and is provided with two regulating plates on side walls thereof; and the moving device is disposed below the evaporation chamber;

wherein the moving device adjusts a relative height between the evaporation source and the regulating plates according to an evaporation condition for an organic material; the evaporation chamber comprises two main evaporation chambers and an impurity evaporation chamber which is positioned between the two main evaporation chambers.

15. The evaporation apparatus according to claim 14, wherein the moving device is disposed below the evaporation source.

16. The evaporation apparatus according to claim 15, wherein the moving device actuates the evaporation source to move up and down, thereby changing a relative height between the evaporation source and the regulating plates.

17. The evaporation apparatus according to claim 14, wherein the moving device is connected with the two regulating plates and actuates the regulating plates to move up and down to change a relative height between the regulating plates and the evaporation source.

18. The evaporation apparatus according to claim 14, wherein the moving device is disposed below the two regulating plates.

* * * * *